US011362299B2

(12) United States Patent
Choi et al.

(10) Patent No.: US 11,362,299 B2
(45) Date of Patent: Jun. 14, 2022

(54) COVER WINDOW AND DISPLAY DEVICE HAVING MULTIPLE RADII OF CURVATURE

(71) Applicant: Samsung Display Co., Ltd., Yongin-si (KR)

(72) Inventors: Sung Min Choi, Seoul (KR); Wook Jae Lee, Seoul (KR); Han Ki Park, Suwon-si (KR); Nam Seok Baik, Seongnam-si (KR); Young Myung Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/891,023

(22) Filed: Jun. 2, 2020

(65) Prior Publication Data

US 2021/0057669 A1     Feb. 25, 2021

(30) Foreign Application Priority Data

Aug. 23, 2019  (KR) .......................... 10-2019-0103700

(51) Int. Cl.
| | |
|---|---|
| *H01L 51/00* | (2006.01) |
| *H01L 51/52* | (2006.01) |
| *H01L 27/14* | (2006.01) |
| *H01L 27/32* | (2006.01) |
| *G02F 1/133* | (2006.01) |

(Continued)

(52) U.S. Cl.
CPC ........ *H01L 51/524* (2013.01); *H01L 27/3244* (2013.01); *H01L 51/0097* (2013.01); *H01L 51/5253* (2013.01); *G02F 1/133528* (2013.01); *H01L 27/14678* (2013.01);
(Continued)

(58) Field of Classification Search
CPC .............. H01L 51/524; H01L 51/0097; H01L 51/5253; H01L 51/5246; H01L 27/3244; H01L 2251/5338; H01L 51/5293; H01L 27/14678; H01L 27/323; H01L 2251/301; G02F 1/133331; G02F 1/133308;
(Continued)

(56) References Cited

U.S. PATENT DOCUMENTS

| | | | |
|---|---|---|---|
| 9,480,174 B2* | 10/2016 | Park | .................. H05K 5/0017 |
| 9,572,267 B2* | 2/2017 | Cho | ...................... E04C 2/20 |

(Continued)

FOREIGN PATENT DOCUMENTS

KR     10-2019-0035919     4/2019

*Primary Examiner* — Ida M Soward
(74) *Attorney, Agent, or Firm* — H.C. Park & Associates, PLC

(57) ABSTRACT

A cover window including a flat portion and a curved portion extending from an end of the flat portion. The curved portion of the cover window includes a first section, a second section, and a third section, where the second section is disposed between the first section and the third section, an inner surface of the cover window contacts with an adhesive layer, a first radius of curvature having an average value of a radius of curvature of the inner surface of the cover window in the first section is greater than a second radius of curvature having an average value of a radius of curvature in the second section, and a third radius of curvature having an average value of a radius of curvature of the inner surface of the cover window in the third section is greater than the second radius of curvature.

17 Claims, 5 Drawing Sheets

(51) Int. Cl.
*G09F 9/30* (2006.01)
*G02F 1/1335* (2006.01)
*H01L 27/146* (2006.01)

(52) U.S. Cl.
CPC ........ *H01L 27/323* (2013.01); *H01L 51/5293* (2013.01); *H01L 2251/301* (2013.01); *H01L 2251/5338* (2013.01)

(58) Field of Classification Search
CPC ............. G02F 1/133528; G06F 1/1637; G06F 1/1652; G06F 1/1626; G09F 9/307
See application file for complete search history.

(56) References Cited

U.S. PATENT DOCUMENTS

| | | | |
|---|---|---|---|
| 9,698,375 B2* | 7/2017 | Prushinskiy | G06F 1/1652 |
| 10,008,554 B2* | 6/2018 | Bae | G02F 1/13439 |
| 10,222,834 B2* | 3/2019 | Choi | G06F 1/1652 |
| 10,236,459 B2* | 3/2019 | Hasegawa | H01L 27/32 |
| 10,315,400 B2* | 6/2019 | Son | B32B 38/18 |
| 10,431,635 B2 | 10/2019 | Breedlove et al. | |
| 10,446,769 B2* | 10/2019 | Kim | G02F 1/133305 |
| 10,476,013 B2* | 11/2019 | Shin | H01L 51/0097 |
| 10,496,136 B2* | 12/2019 | Kim | G06F 1/1652 |
| 10,732,445 B2* | 8/2020 | Shin | G06F 3/045 |
| 10,747,036 B2* | 8/2020 | Araki | G06F 1/16 |
| 2014/0370244 A1* | 12/2014 | Kinoshita | H05K 5/0017 428/177 |
| 2017/0263492 A1* | 9/2017 | Son | H01L 21/67092 |
| 2017/0293194 A1* | 10/2017 | Hou | G06F 1/1626 |
| 2017/0349473 A1* | 12/2017 | Moriya | C03B 23/03 |
| 2017/0373281 A1* | 12/2017 | Park | H01L 51/56 |
| 2018/0009197 A1* | 1/2018 | Gross | C03C 15/00 |
| 2018/0217639 A1* | 8/2018 | Jones | G06F 1/1652 |
| 2018/0284525 A1* | 10/2018 | Notoshi | G02F 1/133305 |
| 2018/0351117 A1* | 12/2018 | Kim | H01L 27/3251 |
| 2018/0375043 A1* | 12/2018 | Jung | B32B 15/08 |
| 2019/0011954 A1* | 1/2019 | Chu | B32B 17/06 |
| 2019/0036048 A1* | 1/2019 | Lee | B32B 27/06 |
| 2019/0140202 A1* | 5/2019 | Jin | H01L 51/0097 |
| 2019/0392737 A1* | 12/2019 | Du | G06F 1/1643 |
| 2020/0064886 A1* | 2/2020 | Cho | H04M 1/0216 |
| 2020/0251671 A1* | 8/2020 | Chu | B32B 3/02 |
| 2021/0034110 A1* | 2/2021 | Hamburgen | G06F 1/1652 |
| 2021/0074773 A1* | 3/2021 | Seomoon | H05K 1/147 |

* cited by examiner

COVER WINDOW AND DISPLAY DEVICE HAVING MULTIPLE RADII OF CURVATURE

CROSS-REFERENCE TO RELATED APPLICATION

This application claims priority from and the benefit of Korean Patent Application No. 10-2019-0103700, filed on Aug. 23, 2019, which is hereby incorporated by reference for all purposes as if fully set forth herein.

BACKGROUND

Field

Exemplary embodiments relate generally to a cover window and a display device having the cover window. More particularly, exemplary embodiments relate to a cover window including a curved portion, which is used for a display device, and a display device including the cover window.

Discussion of the Background

Recently, as technology has progressed, display products having smaller sizes, lighter weights, and superior performance have been produced. Conventional cathode ray tube (CRT) televisions have been widely used for display devices, with many advantages in terms of performance and price. Recently, various other display device technologies have been developed, such as plasma display devices, liquid crystal display devices, and organic light emitting display devices, which overcome weak points of the CRT in terms of miniaturization or portability and have advantages, such as miniaturization, light weight, and low power consumption.

These display devices each include a display panel configured to display an image and a transparent cover window attached to a display surface of the display panel to cover the display surface. The cover window protects the display panel from an external impact, a scratch or the like applied during use. A typical cover window is formed of plastic resin and fabricated by an injection molding process using a mold.

Recently, as smart phones and tablet PCs are increasingly in use, diversity in terms of design is required for display devices mounted to the above devices. In order to satisfy the diversity, a display device (e.g., referred to as an "edge" display device), which is provided with a flexible display panel and a cover window having a curved portion, has been proposed.

However, when the display panel is attached to the cover window in the curved portion, a radius of curvature may decrease as a curved angle of the curved portion becomes steep, thereby causing various defects, such as bubbles due to a bonding process, or peeling which occurs after the bonding process.

The above information disclosed in this Background section is only for understanding of the background of the inventive concepts, and, therefore, it may contain information that does not constitute prior art.

SUMMARY

Exemplary embodiments provide a cover window including a curved portion having improved quality, which is used for a display device.

Exemplary embodiments also provide a display device including the cover window.

Additional features of the inventive concepts will be set forth in the description which follows, and in part will be apparent from the description, or may be learned by practice of the inventive concepts.

An exemplary embodiment provides a cover window including a flat portion and a curved portion extending from an end of the flat portion. The curved portion of the cover window includes a first section, a second section, and a third section, the second section being disposed between the first section and the third section. An inner surface of the cover window contacts with an adhesive layer. A first radius of curvature having an average value of a radius of curvature of the inner surface of the cover window in the first section is greater than a second radius of curvature having an average value of a radius of curvature in the second section, and a third radius of curvature having an average value of a radius of curvature of the inner surface of the cover window in the third section is greater than the second radius of curvature.

The curved portion of the cover window may further include a fourth section, the fourth section is an outer end portion of the curved portion, and the first to third sections may be positioned between the flat portion and the fourth section. In addition, a fourth radius of curvature having an average value of a radius of curvature of the inner surface of the cover window in the fourth section may be less than the third radius of curvature.

The curved portion of the cover window may further include a fifth section, the fifth section may be a portion where the curved portion is connected to the flat portion, and the fifth section may be positioned between the first section and the flat portion. In addition, a fifth radius of curvature having an average value of a radius of curvature of the inner surface of the cover window in the fifth section may be greater than the first to fourth radiuses of curvature.

The curved portion of the cover window may further include a sixth section, and the sixth section may be positioned between the first section and the fifth section. In addition, a sixth radius of curvature having an average value of a radius of curvature of the inner surface of the cover window in the sixth section may be greater than the first radius of curvature and less than the fifth radius of curvature.

The curved portion of the cover window may include the first to sixth sections, a central angle of an arc of the inner surface in the first section of the cover window is a first angle, a central angle of an arc of the inner surface in the second section of the cover window is a second angle, a central angle of an arc of the inner surface in the third section of the cover window is a third angle, a central angle of an arc of the inner surface in the fourth section of the cover window is a fourth angle, a central angle of an arc of the inner surface in the fifth section of the cover window is a fifth angle, a central angle of an arc of the inner surface in the sixth section of the cover window is a sixth angle, a ratio of the first to sixth angles may be 1.00:0.43:0.43:0.62:0.10:0.62, and a ratio of the first to sixth radiuses of curvature may be 0.15:0.12:0.19:0.12:1.00:0.24.

A central angle of an arc of the inner surface in the first section of the cover window is a first angle, a central angle of an arc of the inner surface in the second section of the cover window is a second angle, a central angle of an arc of the inner surface in the third section of the cover window is a third angle, and the first angle may be greater than the second angle and the third angle.

Another exemplary embodiment provides a display device including a flexible display panel, a cover window disposed on the flexible display panel and including a flat portion and a curved portion extending from an end of the flat portion, and an adhesive layer disposed between the flexible display panel and the cover window to attach the flexible display panel to the cover window. The curved portion of the cover window includes a first section, a second section, and a third section, the second section being disposed between the first section and the third section. An inner surface of the cover window contacts with the adhesive layer. A first radius of curvature having an average value of a radius of curvature of the inner surface of the cover window in the first section is greater than a second radius of curvature having an average value of a radius of curvature in the second section, and a third radius of curvature having an average value of a radius of curvature of the inner surface of the cover window in the third section is greater than the second radius of curvature.

The curved portion of the cover window may further include a fourth section, the fourth section may be an outer end portion of the curved portion, and the first to third sections may be positioned between the flat portion and the fourth section. In addition, a fourth radius of curvature having an average value of a radius of curvature of the inner surface of the cover window in the fourth section may be less than the third radius of curvature.

The curved portion of the cover window may further include a fifth section, the fifth section may be a portion where the curved portion is connected to the flat portion, and the fifth section may be positioned between the first section and the flat portion. In addition, a fifth radius of curvature having an average value of a radius of curvature of the inner surface of the cover window in the fifth section may be greater than the first to fourth radiuses of curvature.

The curved portion of the cover window may further include a sixth section, and the sixth section may be positioned between the first section and the fifth section. In addition, a sixth radius of curvature having an average value of a radius of curvature of the inner surface of the cover window in the sixth section may be greater than the first radius of curvature and less than the fifth radius of curvature.

The curved portion of the cover window may include the first to sixth sections, a central angle of an arc of the inner surface in the first section of the cover window may have a first angle, a central angle of an arc of the inner surface in the second section of the cover window may have a second angle, a central angle of an arc of the inner surface in the third section of the cover window may have a third angle, a central angle of an arc of the inner surface in the fourth section of the cover window may have a fourth angle, a central angle of an arc of the inner surface in the fifth section of the cover window may have a fifth angle, a central angle of an arc of the inner surface in the sixth section of the cover window may have a sixth angle, a ratio of the first to sixth angles may be 1.00:0.43:0.43:0.62:0.10:0.62, and a ratio of the first to sixth radiuses of curvature may be 0.15:0.12:0.19:0.12:1.00:0.24.

A central angle of an arc of the inner surface in the first section of the cover window may have a first angle, a central angle of an arc of the inner surface in the second section of the cover window may have a second angle, a central angle of an arc of the inner surface in the third section of the cover window may have a third angle, and the first angle may be greater than the second angle and the third angle.

A radius of curvature of the inner surface in the curved portion of the cover window may be continuously changed from a portion which contacts with the flat portion to an end of an edge of the cover window.

A central angle of an arc of the inner surface with respect to an entire curved portion of the cover window may be greater than 80 degrees.

The flat portion may extend in a first direction, and the curved portion may be bent in a second direction perpendicular to the first direction to form a curved surface. In addition, a length of the curved portion of the cover window in the first direction may be less than 5 mm, and a length in the second direction may be less than 1.5 mm.

The flexible display panel may be an organic light emitting display panel and may include a thin film encapsulation layer bonded to the adhesive layer. In addition, the thin film encapsulation layer may include at least one inorganic layer and at least one organic layer.

The adhesive layer may include an optically clear adhesive (OCA), a super view resin (SVR), a pressure sensitive adhesive (PSA), or an optically clear resin (OCR).

Another exemplary embodiment provides a display device including a flexible display panel, a cover window disposed on the flexible display panel and including a flat portion and a curved portion extending from an end of the flat portion, and an adhesive layer disposed between the flexible display panel and the cover window to attach the flexible display panel to the cover window. An inner surface of the cover window may contact with an adhesive layer. The curved portion of the cover window may include a connection section connected to the flat portion, an outermost section formed in an end of an edge of the cover window, and an intermediate section arranged between the connection section and the outermost section. A connection section radius of curvature having an average value of a radius of curvature of the inner surface of the cover window in the connection section may be greater than an intermediate section radius of curvature having an average value of a radius of curvature of the intermediate section and an outermost section radius of curvature having an average value of a radius of curvature of the outermost section, and the outermost section radius of curvature may be less than the intermediate section radius of curvature.

The intermediate section may include a first section, a second section, and a third section, the second section being disposed between the first section and the third section. In addition, a first radius of curvature having an average value of a radius of curvature of the inner surface of the cover window in the first section may be greater than a second radius of curvature having an average value of a radius of curvature in the second section. Further, a third radius of curvature having an average value of a radius of curvature of the inner surface of the cover window in the third section may be greater than the second radius of curvature.

The flexible display panel may be an organic light emitting display panel and may include a thin film encapsulation layer bonded to the adhesive layer. In addition, the thin film encapsulation layer may include at least one inorganic layer and at least one organic layer, and the adhesive layer may include an optically clear adhesive (OCA), a super view resin (SVR), a pressure sensitive adhesive (PSA), or an optically clear resin (OCR).

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION OF THE EMBODIMENTS

Figure 1:
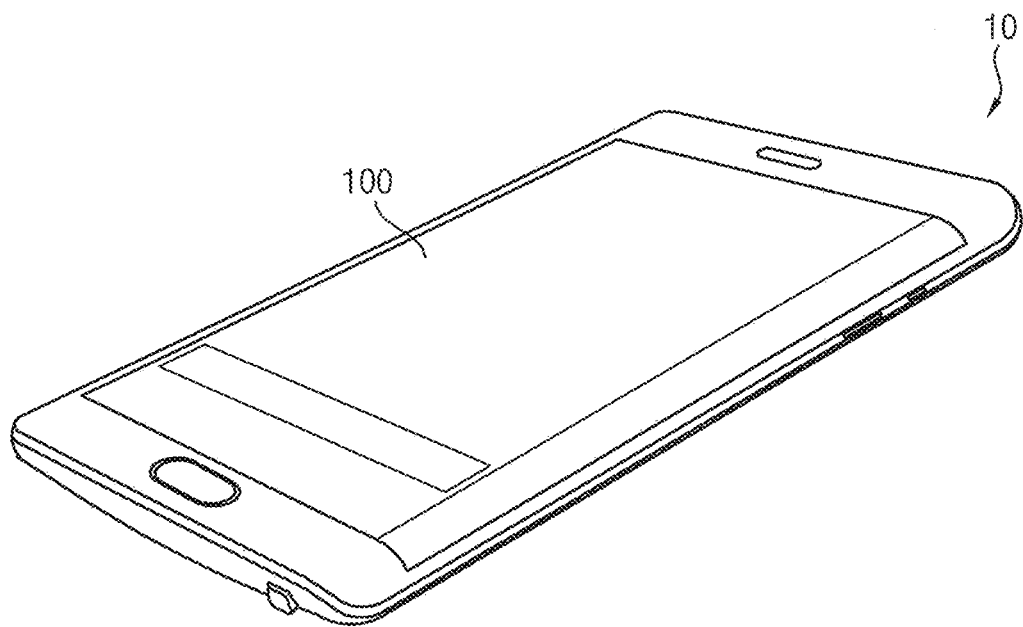
FIG. 1 is a perspective diagram illustrating a display device including a cover window according to exemplary embodiments.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present invention will be explained in detail with reference to the accompanying drawings.

FIG. 1 is a perspective diagram illustrating a display device including a cover window according to exemplary embodiments.

Referring to FIG. 1, an electronic device 10 includes a display device 100 including a display panel (see 110 in FIG. 3) and a cover window (see 130 of FIG. 3) attached to the display panel. The display device 100 includes a flat portion (see FA in FIG. 3) and a pair of curved portions (see EA in FIG. 3) positioned on both sides of the flat portion (an edge display). Although the electronic device 10 is shown as a smart phone, the inventive concepts are not limited thereto. For example, the electronic device 10 may be implemented as a television, a mobile phone, a video phone, a smart pad, a smart watch, a tablet PC, a car navigation system, a computer monitor, a notebook computer, a head mounted display (HMD), or the like.

The pair of curved portions are formed at the both sides of the flat portion so as to be parallel to a long side of the cover window. In addition, the pair of curved portions may be formed in a predetermined shape without changing a curvature in a direction parallel to the long side of the cover window.

The pair of curved portions are formed to have the same curvature with each other, and centers of the curvatures of the two curved portions may be positioned on the same side. FIG. 1 illustrates a case in which the centers of curvatures of the two curved portions are positioned at a lower side of the cover window.

Figure 2:
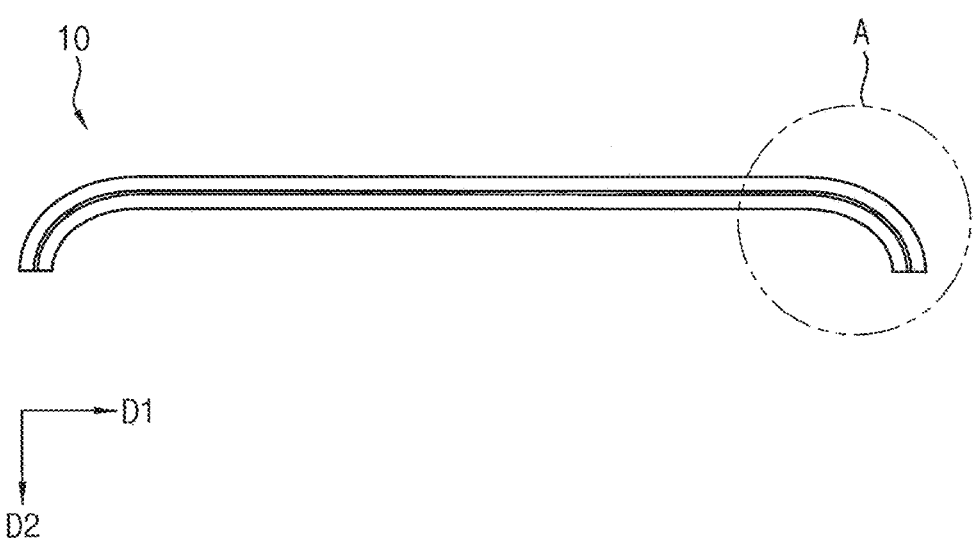
FIG. 2 is a cross-sectional diagram illustrating a cover window and a display panel of the display device 100 of FIG. 1.
Figure 3:
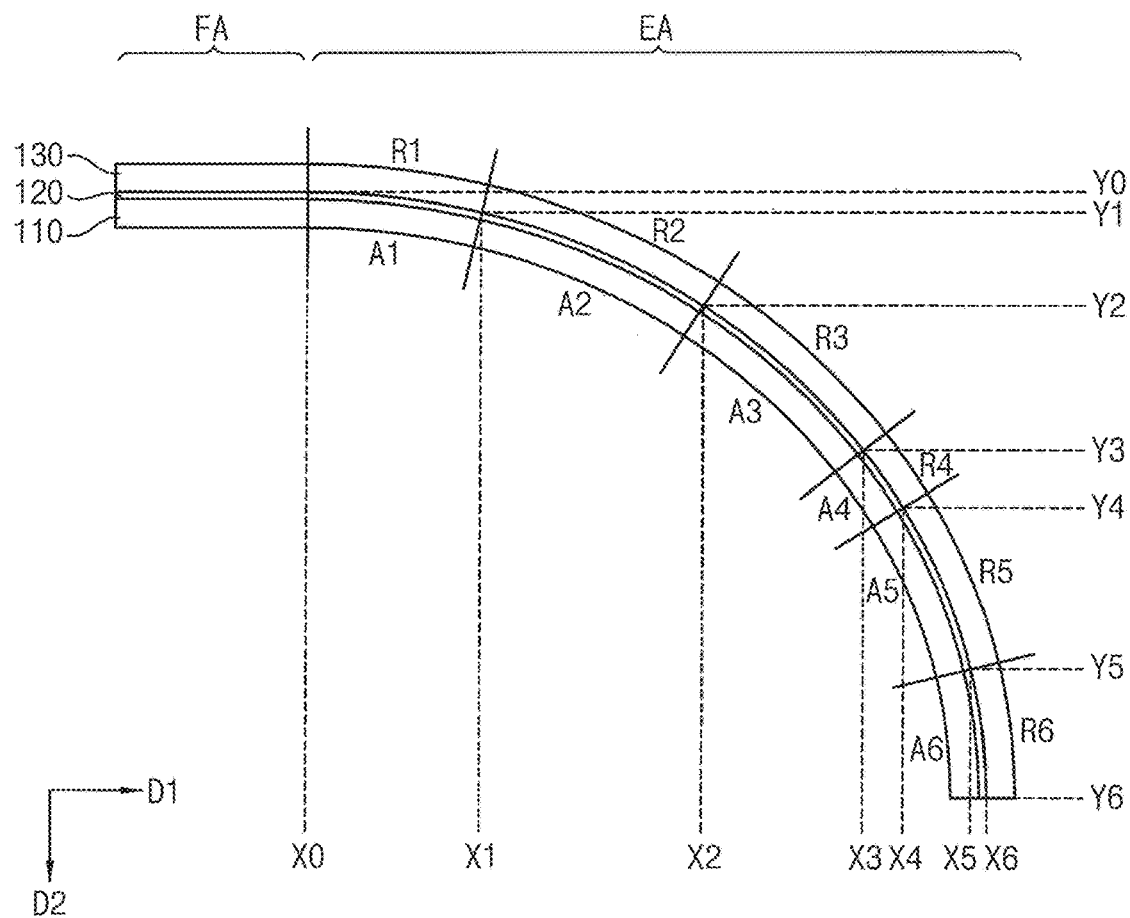
FIG. 3 is a cross-sectional diagram illustrating an edge of curved portions of a cover window and a display panel in FIG. 2.

FIG. 2 is a cross-sectional diagram illustrating a cover window and a display panel of the display device 100 of FIG. 1; FIG. 3 is a cross-sectional diagram illustrating an edge of curved portions of a cover window and a display panel in FIG. 2; and FIG. 4 is a diagram illustrating a first radius of curvature and a first angle of a lower surface of a cover window in a first section in FIG. 3.

Figure 4:
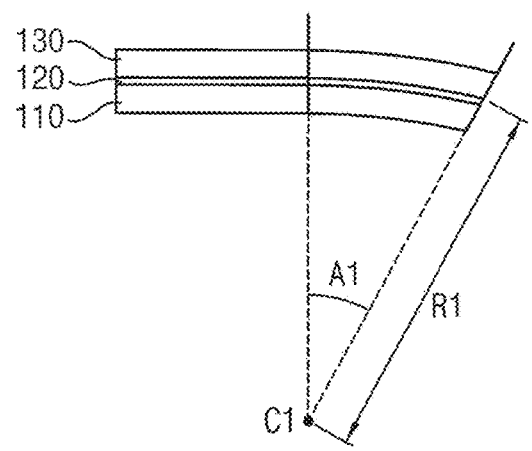
FIG. 4 is a diagram illustrating a first radius of curvature and a first angle of a lower surface of a cover window in a first section in FIG. 3.

Referring to FIGS. 2 to 4, the display device 100 includes a display panel 110, an adhesive layer 120 disposed on the display panel 110, and a cover window 130 disposed on the adhesive layer 120.

The display panel 110 may be a flexible display panel. For example, the display panel 110 may be a flexible organic light emitting display panel. A thin film encapsulation layer TFE may be formed on an uppermost layer of the display panel 110.

The thin film encapsulation layer may be formed on the uppermost layer of the display panel 110 to prevent moisture and oxygen from being permeated from the outside. The thin film encapsulation layer may seal an organic light emitting diode of the display panel 110, in order to reduce deterioration of the organic light emitting diode due to the external moisture and oxygen may be suppressed.

The thin film encapsulation layer may be provided with at least one organic layer and at least one inorganic layer. The at least one organic layer and the at least one inorganic layer may be alternately laminated. For example, the thin film encapsulation layer may include a first inorganic layer, a second inorganic layer, and an organic layer between the first inorganic layer and the second inorganic layer, but it is not limited thereto.

The organic layer of the thin film encapsulation layer may be formed of polymer, and may be, for example, a single film or a laminated film formed of any one of polyethylene terephthalate, polyimide, polycarbonate, epoxy, polyethylene, and polyacrylate. The inorganic layer of the thin film encapsulation layer may be a single layer or a laminated layer including metal oxide or metal nitride. For example, the inorganic layer may include any one of $SiN_x$, $Al_2O_3$, $SiO_2$, and $TiO_2$.

The adhesive layer 120 is disposed between the thin film encapsulation layer of the display panel 110 and the cover window 130, such that the display panel 110 is attached to an inner surface of the cover window 130. The adhesive layer 120 may be a transparent adhesive layer. For example, the adhesive layer may be an optically clear adhesive (OCA), a super view resin (SVR), a pressure sensitive adhesive (PSA), an optically clear resin (OCR), or a combination thereof, but is not limited thereto. In an exemplary embodiment, the adhesive layer 120 may include an acrylic binder.

The cover window 130 may be formed of a plastic material. For example, the cover window 130 may include polycarbonate, cycloolefin polymer, polymethyl methacrylate, and the like. In another example embodiment, the cover window 130 may include quartz, synthetic quartz, calcium fluoride, fluorine-doped quartz (F-doped quartz), soda-lime glass, non-alkali glass, and the like.

The cover window 130 may include a flat portion FA and a curved portion EA connected to an end of the flat portion FA. The curved portion EA may be bent to have a curved surface in a second direction D2 perpendicular to a first direction D1 that is a direction in which the flat portion FA extends.

According to the illustrated exemplary embodiment, the curved portion EA is divided into six sections, but is not limited thereto. For example, the curved portion EA may be divided into at least three sections, and a radius of curvature and an angle in each of the sections may be continuously changed (see descriptions for FIG. 5 to be described later).

Although not shown, the display device 100 may further include a touch sensor unit and an optical film such as a polarizing film that are positioned between the display panel 110 and the cover window 130.

In keeping with current design trends of the electronic device 10, the angle corresponding to the entire curved portion EA is close to 90 degrees, and the radius of curvature corresponding to the entire curved portion EA decreases. Accordingly, it was confirmed that a peel defect, in which bubbles are formed between the adhesive layer 120 and the cover window 130, occurs because a peel load is applied to the adhesive layer 120 and a stress is applied to the thin film encapsulation layer (hereinafter referred to as TFE) of the display panel 110.

The peel defect may be caused by the stress applied to the thin film encapsulation layer and the peel load applied to the adhesive layer 120. In addition, it is predicted that the peel defect may be alleviated by changing the design of the inner surface of the cover window 120 which contacts with the adhesive layer 130. Thus, the design, which is adapted to minimize a TFE stress (the stress applied to the thin film encapsulation layer) and an OCA peel load (the peel load applied to the adhesive layer) within the same design requirements, is arrived at by applying optimization techniques.

The optimization techniques may be performed using various schemes. For example, the configuration for the cover window 130 may be designed by using experiment values preset through "design of experiment" (DOE), and the sum of the TFE stress (σTFE) and the OCA peel load (POCA) in the experimental values may be calculated. Then, in order to find out a minimum value of a sum of the TFE stress (σTFE) and the OCA peel load (POCA), the design of the cover window for minimizing the values of the TFE stress (σTFE) and the OCA peel load (POCA) may be realized through optimization techniques, such as regression analysis and "least squares" method.

The "design of experiment" refers to a scheme of selecting, at a low cost, an important factor among various factors causing an abnormal change and quantitatively measuring an effect derived therefrom, based on statistical analysis. The "least squares" method refers to a scheme of processing a measured result by making an appropriate sum of squares based on a measured value and calculating a value that minimizes the sum of squares, and it is also called a "least squares fitting".

The above-described processing may be performed using various known analysis tools or solutions.

In an exemplary embodiment, even when the radius of curvature of the curved portion EA of the cover window 130 is small and the central angle of the arc with respect to the entire curved portion EA is large, the bubble defect, peel defect, or the like may be prevented.

A length of the curved portion EA of the cover window 130 in the first direction D1 (a distance from X0 to X6 in the drawing) may be less than 5 mm (millimeter), and a length in the second direction D2 (a distance from Y0 to Y6 in the drawing) may be less than 1.5 mm. The central angle of the arc of the inner surface with respect to the entire curved portion EA of the cover window 130 may be more than 80 degrees.

According to an exemplary embodiment, a design range of the cover window 130 is as follows. The central angle of the arc of the inner surface with respect to the entire curved portion EA of the cover window 130 may be 88.9 degrees, the curved portion EA may be divided into six sections, the length of the curved portion EA in the first direction D1 may be 4.803 mm, and the length of the curved portion EA in the second direction D2 may be 1.117 mm.

Design variables having the lowest TFE stress (σTFE) and the OCA peel load (POCA) were calculated by performing the optimization techniques within error ranges of 0.001 mm and 0.01 degree with respect to the design range.

Table 1 below shows the optimum design of the inner surface (the surface which contacts with the adhesive layer) of the cover window 130.

TABLE 1

|  | 1st section | 2nd section | 3rd section | 4th section | 5th section | 6th section |
|---|---|---|---|---|---|---|
| Angle (°) | A1 2.6 | A2 16.8 | A3 26.9 | A4 11.6 | A5 14.3 | A6 16.8 |
| Radius of curvature (mm) | R1 27.7 | R2 6.7 | R3 4.2 | R4 3.2 | R5 5.4 | R6 3.2 |

The first section refers to a section from point (X0, Y0) to point (X1, Y1), the second section refers to a section from point (X1, Y1) to point (X2, Y2), the third section refers to a section from point (X2, Y2) to point (X3, Y3), the fourth section refers to a section from point (X3, Y3) to point (X4, Y4), the fifth section refers to a section from point (X4, Y4) to point (X5, Y5), and the sixth section refers to a section from point (X5, Y5) to point (X6, Y6).

The "radius of curvature" refers to an average radius of curvature in each section, and the angle refers to a central angle of an arc in each section (see FIG. 4).

The curved portion is divided into six sections. This is because the optimum design of the cover window may be inefficiently found out when the curved portion is divided into too many numbers of sections, and the design, which minimizes the TFE stress (σTFE) and the OCA peel load (POCA) compared to a simple curved portion (that is, design having one radius of curvature), cannot be calculated when the curved portion is divided into too few numbers of sections.

Figure 5:
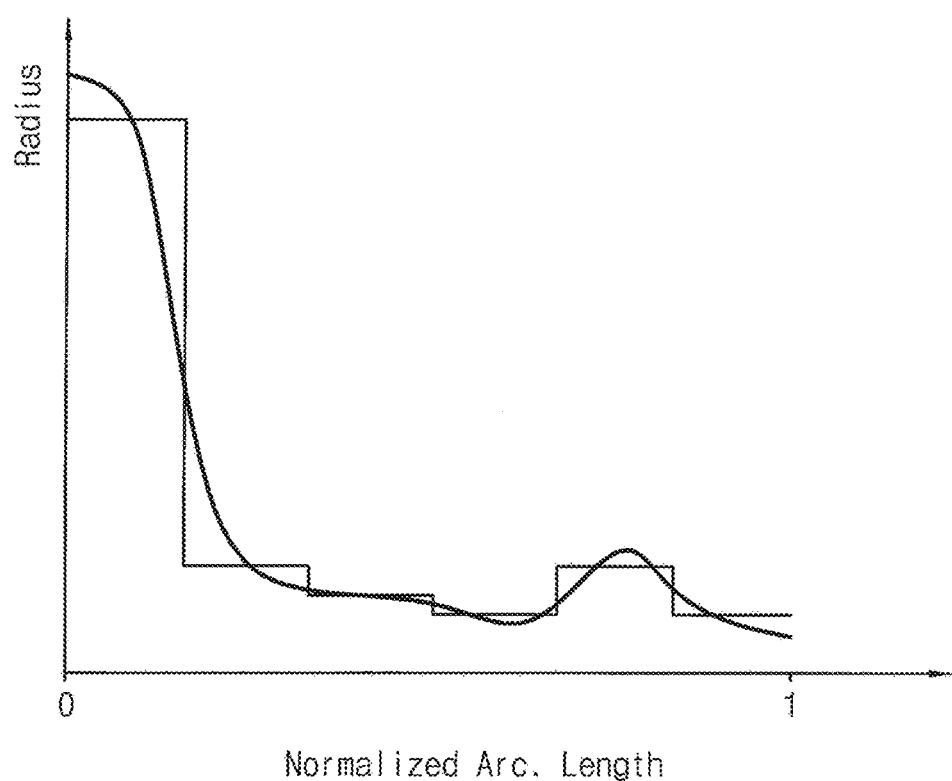
FIG. 5 is a graph showing a radius of curvature according to positions at a curved portion of an inner surface of a cover window in FIG. 3.

The radius of curvature of the inner surface at the curved portion EA of the cover window 130 may be continuously changed from the portion (X0, Y0) which contacts with the flat portion FA to an end of the edge (X6, Y6) of the cover window 130 (see FIG. 5).

Table 2 below shows design for a comparative example compared with the optimum design shown above in Table 1, according to exemplary embodiments.

TABLE 2

|  | 1st section | 2nd section | 3rd section | 4th section | 5th section | 6th section |
|---|---|---|---|---|---|---|
| Angle (°) | A1 2.0 | A2 14.4 | A3 26.9 | A4 9.3 | A5 32.1 | A6 4.3 |
| Radius of curvature (mm) | R1 43.5 | R2 7.9 | R3 3.4 | R4 3.2 | R5 3.6 | R6 9.6 |

In the case of the cover window and the display panel according to the design of the comparative example, the defect occurred in which the adhesive layer between the cover window and the display panel was spaced to cause bubbles.

In contrast, in the case of the cover window and the display panel according to the optimum design, it was confirmed that the defect did not occur in which the adhesive layer between the cover window and the display panel was spaced to cause bubbles.

Table 3 below shows values obtained by normalizing the design values of the optimum design.

TABLE 3

|  | 1st section | 2nd section | 3rd section | 4th section | 5th section | 6th section |
| --- | --- | --- | --- | --- | --- | --- |
| Angle (°) | A1 0.10 | A2 0.62 | A3 1.00 | A4 0.43 | A5 0.43 | A6 0.62 |
| Radius of curvature (mm) | R1 1.00 | R2 0.24 | R3 0.15 | R4 0.12 | R5 0.19 | R6 0.12 |

FIG. 5 is a graph showing a radius of curvature according to positions at a curved portion of an inner surface of a cover window in FIG. 3.

Referring to FIG. 5, although the average radius of curvature of each section is expressed by a straight line, the radius of curvature of the inner surface at the curved portion of the actual cover window may be continuously changed from the portion which contacts with the flat portion to the end of the edge of the cover window (the curve of the graph).

Figure 6A:
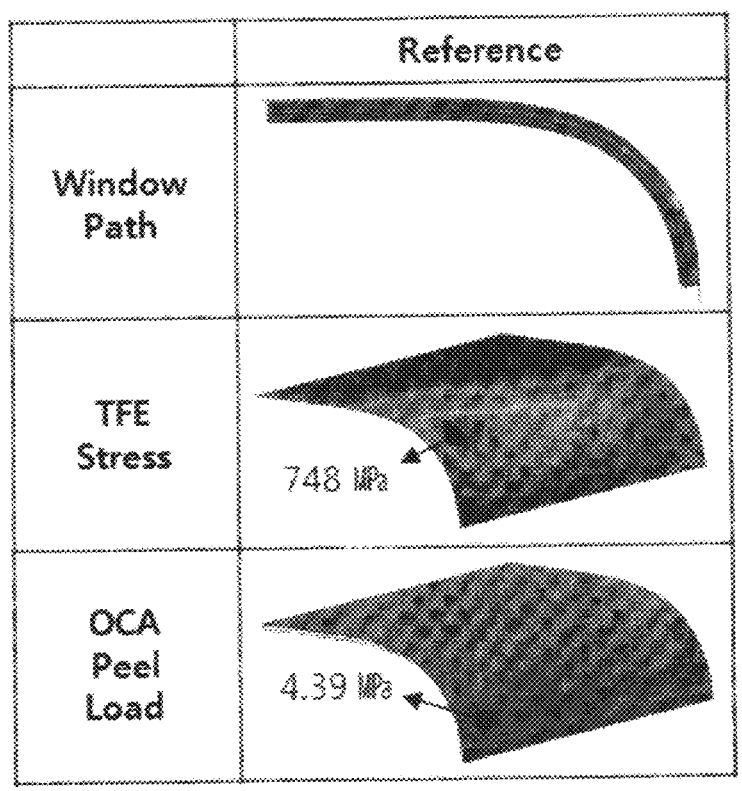
FIG. 6A is a diagram illustrating a sectional shape of a curved portion of a display device, a stress of a thin film encapsulation layer, and a peeling load of an adhesive layer according to a comparative example.
Figure 6B:
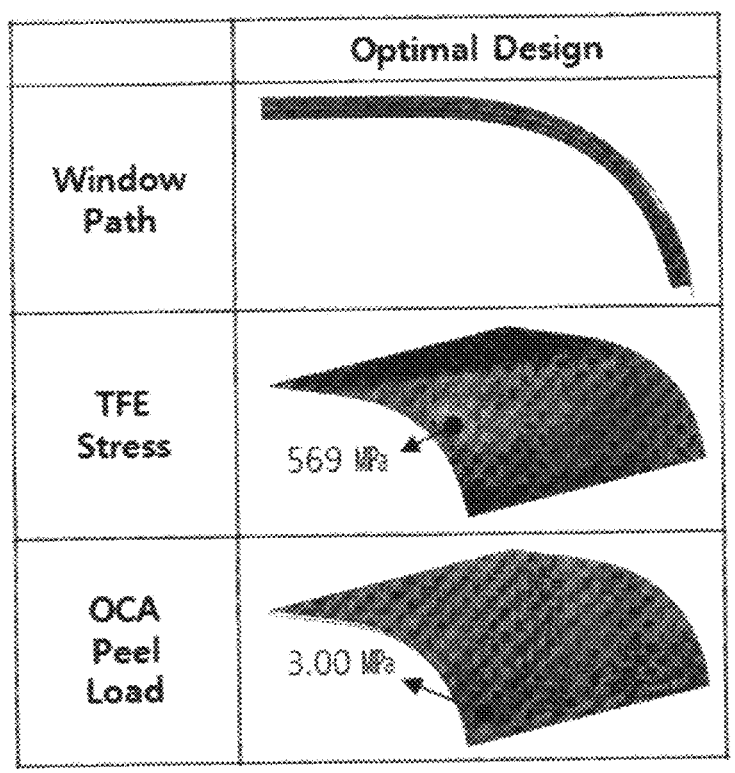
FIG. 6B is a diagram illustrating a sectional shape of a curved portion of a display device, a stress of a thin film encapsulation layer, and a peeling load of an adhesive layer according to exemplary embodiments.

FIG. 6A is a diagram illustrating a sectional shape of a curved portion of a display device, a stress of a thin film encapsulation layer, and a peeling load of an adhesive layer according to a comparative example, and FIG. 6B is a diagram illustrating a sectional shape of a curved portion of a display device, a stress of a thin film encapsulation layer, and a peeling load of an adhesive layer according to Exemplary embodiments.

Referring to FIGS. 6A and 6B, according to Exemplary embodiments, it was confirmed by simulation results that the maximum value of the stress of the thin film encapsulation layer (TFE stress) was reduced from 748 Mpa (mega pascal) to 569 Mpa, compared to the comparative example.

In addition, according to exemplary embodiments, it was confirmed by the simulation results that the maximum value of the peel load (OCA Peel Load) of the adhesive layer (optically clear adhesive; OCA) was reduced from 4.39 Mpa to 3.00 Mpa, compared to the comparative example.

In exemplary embodiments, the cover window includes a flat portion and a curved portion extending from an end of the flat portion. The curved portion of the cover window may be divided into a plurality of sections, and each of the sections may have a radius of curvature and an angle according to the optimum design designed through the optimization technique.

For example, the curved portion of the cover window may include a first section, a second section and a third section, in which the second section may be disposed between the first section and the third section. An inner surface of the cover window may be a surface which contacts with the adhesive layer. A first radius of curvature, which is an average value of a radius of curvature of an inner surface of the cover window of the first section, may be greater than a second radius of curvature, which is an average value of a radius of curvature of the second section. A third radius of curvature, which is an average value of a radius of curvature of an inner surface of the cover window of the third section, may be greater than the second radius of curvature.

Accordingly, even when the radius of curvature of the curved portion of the cover window is small and a central angle of an arc is great with respect to the entire curved portion, the bubble defect, peel defect, or the like may be prevented.

The present inventive concepts may be applied to an organic light-emitting display device and an electronic apparatus including the organic light-emitting display device. For example, the present inventive concept may be applied to a smart phone, a cellular phone, a video phone, a smart pad, a smart watch, a tablet PC, a car navigation system, a television, a computer monitor, a laptop, a head mounted display (HMD) device, etc.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A cover window comprising:
a flat portion; and
a curved portion extending from an end of the flat portion, wherein:
the curved portion of the cover window includes a first section, a second section, and a third section, the second section being disposed between the first section and the third section;
an inner surface of the cover window contacts with an adhesive layer;
a first radius of curvature having an average value of a radius of curvature of the inner surface of the cover window in the first section is greater than a second radius of curvature having an average value of a radius of curvature in the second section; and
a third radius of curvature having an average value of a radius of curvature of the inner surface of the cover window in the third section is less than the second radius of curvature.

2. The cover window of claim 1, wherein:
the curved portion of the cover window further includes a fourth section, the first to third sections being positioned between the flat portion and the fourth section; and
a fourth radius of curvature having an average value of a radius of curvature of the inner surface of the cover window in the fourth section is less than the third radius of curvature.

3. The cover window of claim 2, wherein:
the curved portion of the cover window further includes a fifth section, the first to fourth sections being positioned between the flat portion and the fifth section; and
a fifth radius of curvature having an average value of a radius of curvature of the inner surface of the cover window in the fifth section is greater than the third and fourth radiuses of curvature.

4. The cover window of claim 3, wherein:
the curved portion of the cover window further includes a sixth section, and the first to fifth sections are positioned between the flat portion and the sixth section; and
a sixth radius of curvature having an average value of a radius of curvature of the inner surface of the cover window in the sixth section is less than the first, second, and fifth radiuses of curvature.

5. The cover window of claim 4, wherein:
the curved portion of the cover window includes the first to sixth sections;
a central angle of an arc of the inner surface in the first section of the cover window is a first angle;

a central angle of an arc of the inner surface in the second section of the cover window is a second angle;
a central angle of an arc of the inner surface in the third section of the cover window is a third angle;
a central angle of an arc of the inner surface in the fourth section of the cover window is a fourth angle;
a central angle of an arc of the inner surface in the fifth section of the cover window is a fifth angle;
a central angle of an arc of the inner surface in the sixth section of the cover window is a sixth angle;
a ratio of the first to sixth angles is 0.10:0.62:1.00:0.43: 0.43:0.62; and
a ratio of the first to sixth radiuses of curvature is 1.00:0.24:0.15:0.12:0.19:0.12.

6. The cover window of claim 3, wherein:
a central angle of an arc of the inner surface in the third section of the cover window is a third angle;
a central angle of an arc of the inner surface in the fourth section of the cover window is a second fourth angle;
a central angle of an arc of the inner surface in the fifth section of the cover window is a fifth angle; and
the third angle is greater than the fourth angle and the fifth angle.

7. A display device comprising:
a flexible display panel;
a cover window disposed on the flexible display panel and including a flat portion and a curved portion extending from an end of the flat portion; and
an adhesive layer disposed between the flexible display panel and the cover window to attach the flexible display panel to the cover window,
wherein:
the curved portion of the cover window includes a first section, a second section, and a third section, the second section being disposed between the first section and the third section;
an inner surface of the cover window contacts with the adhesive layer;
a first radius of curvature having an average value of a radius of curvature of the inner surface of the cover window in the first section is greater than a second radius of curvature having an average value of a radius of curvature in the second section; and
a third radius of curvature having an average value of a radius of curvature of the inner surface of the cover window in the third section is less than the second radius of curvature.

8. The display device of claim 7, wherein:
the curved portion of the cover window further includes a fourth section, the first to third sections being positioned between the flat portion and the fourth section; and
a fourth radius of curvature having an average value of a radius of curvature of the inner surface of the cover window in the fourth section is less than the third radius of curvature.

9. The display device of claim 8, wherein:
the curved portion of the cover window further includes a fifth section, the first to fourth sections being positioned between the flat portion and the fifth section; and
a fifth radius of curvature having an average value of a radius of curvature of the inner surface of the cover window in the fifth section is greater than the third and fourth radiuses of curvature.

10. The display device of claim 9, wherein:
the curved portion of the cover window further includes a sixth section, and the first to fifth sections are positioned between the flat portion and the sixth section; and
a sixth radius of curvature having an average value of a radius of curvature of the inner surface of the cover window in the sixth section is less than the first, second, and fifth radiuses of curvature.

11. The display device of claim 10, wherein:
the curved portion of the cover window includes the first to sixth sections;
a central angle of an arc of the inner surface in the first section of the cover window is a first angle;
a central angle of an arc of the inner surface in the second section of the cover window is a second angle;
a central angle of an arc of the inner surface in the third section of the cover window is a third angle;
a central angle of an arc of the inner surface in the fourth section of the cover window is a fourth angle;
a central angle of an arc of the inner surface in the fifth section of the cover window has a fifth angle;
a central angle of an arc of the inner surface in the sixth section of the cover window has a sixth angle;
a ratio of the first to sixth angles is 0.10:0.62:1.00:0.43: 0.43:0.62; and
a ratio of the first to sixth radiuses of curvature is 1.00:0.24:0.15:0.12:0.19:0.12.

12. The display device of claim 9, wherein:
a central angle of an arc of the inner surface in the third section of the cover window is a third angle;
a central angle of an arc of the inner surface in the fourth section of the cover window is a fourth angle;
a central angle of an arc of the inner surface in the fifth section of the cover window is a fifth angle; and
the third angle is greater than the fourth angle and the fifth angle.

13. The display device of claim 7, wherein a radius of curvature of the inner surface in the curved portion of the cover window is continuously changed from a portion which contacts with the flat portion to an end of an edge of the cover window.

14. The display device of claim 7, wherein a central angle of an arc of the inner surface with respect to an entire curved portion of the cover window is greater than 80 degrees.

15. The display device of claim 14, wherein:
the flat portion extends in a first direction, and the curved portion is bent in a second direction perpendicular to the first direction to form a curved surface; and
a length of the curved portion of the cover window in the first direction is less than 5 mm, and a length in the second direction is less than 1.5 mm.

16. The display device of claim 7, wherein:
the flexible display panel is an organic light emitting display panel and includes a thin film encapsulation layer bonded to the adhesive layer; and
the thin film encapsulation layer includes at least one inorganic layer and at least one organic layer.

17. The display device of claim 16, wherein the adhesive layer includes an optically clear adhesive (OCA), a super view resin (SVR), a pressure sensitive adhesive (PSA), or an optically clear resin (OCR).

* * * * *